(12) United States Patent
Han et al.

(10) Patent No.: US 12,541,154 B2
(45) Date of Patent: Feb. 3, 2026

(54) OPTICAL METHOD AND APPARATUS FOR QUICKLY REALIZING PRECISE CALIBRATION OF LITHOGRAPHY SYSTEM

(71) Applicant: INSTITUTE OF MICROELECTRONICS, CHINESE ACADEMY OF SCIENCES, Beijing (CN)

(72) Inventors: Dandan Han, Beijing (CN); Yayi Wei, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 102 days.

(21) Appl. No.: 18/294,989

(22) PCT Filed: Dec. 29, 2021

(86) PCT No.: PCT/CN2021/142264
§ 371 (c)(1),
(2) Date: Feb. 6, 2024

(87) PCT Pub. No.: WO2023/065534
PCT Pub. Date: Apr. 27, 2023

(65) Prior Publication Data
US 2024/0345488 A1    Oct. 17, 2024

(30) Foreign Application Priority Data

Oct. 18, 2021 (CN) .......................... 202111209569.5

(51) Int. Cl.
*G03F 7/00*    (2006.01)
(52) U.S. Cl.
CPC ...... *G03F 7/70516* (2013.01); *G03F 7/70141* (2013.01); *G03F 7/70258* (2013.01); *G03F 7/70558* (2013.01)

(58) Field of Classification Search
CPC ............ G03F 7/70516; G03F 7/70141; G03F 7/70258; G03F 7/70558; G03F 7/70383; G03F 7/705
See application file for complete search history.

(56) References Cited

U.S. PATENT DOCUMENTS

| 7,030,966 B2 * | 4/2006 | Hansen | ............... G03F 7/70125 355/71 |
| 7,262,831 B2 * | 8/2007 | Akhssay | ................. G03F 7/706 430/30 |

(Continued)

FOREIGN PATENT DOCUMENTS

| CN | 101258498 A | 9/2008 |
| CN | 105404100 A | 3/2016 |

(Continued)

OTHER PUBLICATIONS

International Search Report for PCT/CN2021/142264, mailed Apr. 22, 2022, 12 pages.

*Primary Examiner* — Hung V Nguyen
(74) *Attorney, Agent, or Firm* — Goodwin Procter LLP

(57) ABSTRACT

A method for fast precise optical calibration on a photolithography system, including: determining a fitting relationship for a spot width corresponding to a point light source based on distribution of field strength generated by the point light source at an exit plane of a focusing element; determining, based on the fitting relationship, a first correspondence between the spot width and a parameter for exposing a photoresist, where the spot width in the first correspondence is for optical microscopy; determining a first spot-width dataset for the point light source based on an optical microscopic image of a spot-mapping pattern on a surface of the photoresist; determining, based on the first spot-width dataset, a second correspondence between the spot width and the parameter; and determining the first correspondence (Continued)

as a means for determining the parameter, when the first correspondence and the second correspondence meet a preset condition.

9 Claims, 5 Drawing Sheets

(56) References Cited

U.S. PATENT DOCUMENTS

| | | | |
|---|---|---|---|
| 7,488,933 B2* | 2/2009 | Ye | G03F 7/705 |
| | | | 716/54 |
| 11,003,089 B2* | 5/2021 | Yu | G03F 7/22 |
| 11,556,052 B2* | 1/2023 | Melvin, III | G03F 1/20 |
| 2005/0281451 A1 | 12/2005 | Starikov | |
| 2007/0031745 A1 | 2/2007 | Ye et al. | |
| 2009/0176168 A1 | 7/2009 | Ogino et al. | |
| 2019/0018324 A1 | 1/2019 | Pauls et al. | |

FOREIGN PATENT DOCUMENTS

| | | |
|---|---|---|
| CN | 109073787 A | 12/2018 |
| JP | 20198061013 | 4/2018 |
| TW | 200933700 A | 8/2009 |

* cited by examiner

OPTICAL METHOD AND APPARATUS FOR QUICKLY REALIZING PRECISE CALIBRATION OF LITHOGRAPHY SYSTEM

The present application is the national phase of International Application No. PCT/CN2021/142264, titled "OPTICAL METHOD AND APPARATUS FOR QUICKLY REALIZING PRECISE CALIBRATION OF LITHOGRAPHY SYSTEM", filed on Dec. 29, 2021, which claims priority to Chinese Patent Application CN202111209569.5, titled "METHOD AND APPARATUS FOR FAST PRECISE OPTICAL CALIBRATION ON PHOTOLITHOGRAPHY SYSTEM", filed on Oct. 18, 2021 with the China National Intellectual Property Administration, which is incorporated herein by reference in its entirety.

FIELD

The present disclosure relates to the field of optics, and in particular to a method and an apparatus for fast precise optical calibration on a photolithography system.

BACKGROUND

Photolithography is capable to achieve a high resolution and hence plays an important role in the field of manufacturing micro/nano structure devices. In recent years, various nano-level photolithography techniques have been successively developed to break through the optical limit and bridle the semiconductor industry in accordance with the Moore's law. Each nano-level photolithography technique faces its own challenges on a road towards micro/nano structure devices of multiple critical dimensions and complex structures. The most important issue is a capability of processing diversified large patterns in engineering applications. Thus, a photolithography system should have high alignment precision and high stability to prevent distortion of a target pattern during exposure, which results in poor quality of a final pattern in photoresist and hinders final micro/nano structure devices from achieving their functions. Since an exposed pattern transferred to the photoresist requires good uniformity and fidelity, system calibration becomes an important step in a nano-level photolithography process for accurate regulation of an exposure dose and quantitative characterization of system performances.

Surface plasmon (SP) super diffraction photolithography is a type of maskless near-field nano-level photolithography, and is advantageous in circumventing the diffraction limit and having a low cost. The SP super diffraction photolithography has to balance between a resolution and an exposure latitude (EL). The EL of SP the super diffraction photolithography narrows sharply with a decrease of a critical dimension of an exposure pattern, and hence an exposure dose becomes a vital factor determining quality of the exposure pattern. Especially, when the critical dimension is quite small, such as less than 100 nm, a small change in the exposure dose results in a great change in the quality of the exposure pattern directly. An inadequate exposure dose would result in an undersized or unexposed pattern, that is, the pattern is of poor fidelity. An excessive exposure dose would result in an oversized or over-exposed pattern, that is, uniformity of the pattern cannot be ensured. In a direct-writing SP super diffraction photolithography system, a bowtie nano-aperture (BNA) structure serves as a focusing element and is fixed at a bottom of a direct-writing probe. The BNA structure has better optical restraint capability and a longer cut-off wavelength than other nano-aperture structures (such as H-shaped, C-shaped, and I-shaped ones) and thus can achieve a better resolution. Experimental results have shown that a direct-writing SP super diffraction photolithography system, in which the BNA structure serves as the focusing element, can achieve a resolution of 22 nm. The exposure latitude of the direct-writing SP super diffraction photolithography system becomes rather narrow at a level of such small critical dimension. In such case, system alignment, a contact distance, sample table inclination. BNA transmission, and external vibration all have a great impact on the exposure latitude the photolithography system, and it is an urgent issue to ensure an optimal exposure dose on a photoresist surface during an exposure process. A theoretical research indicates that in a direct-writing SP super diffraction photolithography system, the exposure dose reaching a surface of the photoresist is determined by field strength at an exit plane of the BNA and exposure duration, and the exposure dose determines directly a width of a spot pattern on the photoresist surface. A change of the exposure dose with respect to the exposure duration can be precisely reflected by recording a spot-mapping pattern on the surface of the photoresist. That is, when the field strength at the exit plane of the BNA is constant, the exposure duration increases gradually according to a certain increment, and hence the exposure dose on the surface of photoresist also increases gradually. Thus, a series of spot patterns having gradually increasing widths are acquired. A calibration curve may be obtained through a change of the measured spot widths in the spot-mapping pattern with respect to the exposure dose. Such calibration curve not only reflects a calibration result of the direct-writing SP super diffraction photolithography system, but also may serve as a direct reference for determining a processing parameter required by different photolithography patterns.

A spot width of such spot-mapping pattern may range from several nanometers to hundreds of nanometers, and an atomic force microscopy (AFM) is required for measurement. The atomic force microscopy takes at least four hours in measurement, which increases a time consumption and calibration complexity of the system greatly.

SUMMARY

A method and an apparatus for fast precise optical calibration on a photolithography system are provided according to embodiments of the present disclosure, in order to address an issue of large time consumption and a complex process when determining an exposure parameter in conventional technology.

In a first aspect, a method for fast precise optical calibration on a photolithography system is provided. The method is applied to calibration of a photolithography system, and includes: determining a fitting relationship for a spot width corresponding to a point light source based on distribution of field strength generated by the point light source at an exit plane of a focusing element: determining, based on the fitting relationship, a first correspondence between the spot width and a parameter for exposing a photoresist, where the spot width in the first correspondence is for optical microscopy: determining a first spot-width dataset for the point light source based on an optical microscopic image of a spot-mapping pattern on a surface of the photoresist: determining, based on the first spot-width dataset, a second correspondence between the spot width and the parameter for exposing the photoresist; and determining the first correspondence as a means for determining the parameter for exposing the photoresist, when the first correspondence and the second correspondence meet a preset condition.

In the foregoing technical solution, the method for fast precise optical calibration on the photolithography system is provided according to embodiments of the present disclosure. The fitting relationship for the spot width corresponding to the point light source is determined based on the distribution of the field strength generated by the point light source at the exit plane of the focusing element. The first correspondence between the spot width and the parameter for exposing the photoresist is determined based on the fitting relationship, where the spot width in the first correspondence is for the optical microscopy. The first spot-width dataset for the point light source is determined based on the optical microscopic image of the spot-mapping pattern on the surface of the photoresist. The second correspondence between the spot width and the parameter for exposing the photoresist is determined based on the first spot-width dataset. The first correspondence serves as the means for determining the parameter for exposing the photoresist, when the first correspondence and the second correspondence meet the preset condition. The first correspondence having high accuracy can be obtained through the fitting relationship derived from the distribution of the field strength generated by the point light source, and the parameter for exposure can be determined based on the first correspondence. The forgoing process is fast. Generally, the parameter can be determined in approximate 2 minutes, while it takes at least 4 hours through atomic force microscopy in conventional technology. The method for fast precise optical calibration on the photolithography system according to embodiments of the present disclosure can obtain the parameter for exposure rapidly, the parameter for exposure can be timely measured in experiments, and a process of the experiments can be accurately adjusted and controlled based on the parameter. A simple process is achieved since it takes less time to determine the parameter for exposure.

In an embodiment, determining the first spot-width dataset for the point light source based on the optical microscopic image of the spot-mapping pattern on the surface of the photoresist includes: acquiring the optical microscopic image via an optical microscope; and determining the first spot-width dataset based on the optical microscopic image, where the first spot-width dataset corresponds to a far-field region of the point light source.

In an embodiment, determining the first correspondence as the means for determining the parameter for exposing the photoresist, when the first correspondence and the second correspondence meet the preset condition, includes: acquiring a first average deviation between the second correspondence and the first correspondence; and determining the first correspondence as the means for determining the parameter for exposing the photoresist, when the first average deviation is less than a preset deviation threshold.

In an embodiment, determining the fitting relationship for the spot width corresponding to the point light source based on the distribution of the field strength generated by the point light source at the exit plane of the focusing element includes: determining fitting equations for spot widths corresponding to at least two point light sources, respectively, based on the distribution of the field strength generated by the at least two point light sources at the exit plane of the focusing element; and determining the first correspondence as the means for determining the parameter for exposing the photoresist, when the first correspondence and the second correspondence meet the preset condition, includes: determining the first correspondence corresponding to the at least two point light sources as the means for determining the parameter for exposing the photoresist, when the first correspondence and the second correspondence meet the preset condition.

In an embodiment, the focusing element includes a bowtie nano-aperture structure, and determining the fitting relationship for the spot width corresponding to the point light source based on the distribution of the field strength generated by the point light source at the exit plane of the focusing element includes: acquiring distribution of field strength of the point light source after the point light source passes through the bowtie nano-aperture structure; and determining the fitting relationship based on the distribution of the field strength of the point light source.

In an embodiment, the fitting relationship for the spot width meets an equation:

$$w = 2\sqrt{\frac{cIT}{E_{th}}t} = 2\sqrt{\frac{cT}{E_{th}}}\sqrt{It} = a\sqrt{It},$$

where w represents the spot width, c represents an intrinsic parameter of the photolithography system, I represents the field strength generated by the point light source at the exit plane of the bowtie nano-aperture structure, t represents exposure duration, T represents transmissivity of the bowtie nano-aperture structure, $E_{th}$ represents a threshold dose for exposure, and a represents a slope of a correspondence between the spot width and the parameter for exposing the photoresist.

In an embodiment, the exposure parameter includes exposure duration and a dose for exposure, and the dose meets an equation:

$$E(r) \cong TIt\frac{c}{r^2},$$

where E(r) represents the dose, r represents a distance between a location and a center of the point light source. In a spot-mapping pattern, r represents the spot width, which corresponds to the point light source, in the spot-mapping pattern.

In an embodiment, determining, based on the fitting relationship, the first correspondence between the spot width and the parameter for exposing the photoresist includes: determining a second spot-width dataset, which corresponds to a far-field region and a near-field region of the point light source, based on the fitting relationship; and determining the first correspondence based on the second spot-width dataset.

In an embodiment, after determining the fitting relationship for the spot width corresponding to the point light source based on the distribution of the field strength generated by the point light source at the exit plane of the focusing element, the method further includes, determining a third spot-width dataset for the point light source based on an atomic force microscopy image of the spot-mapping pattern on the surface of the photoresist; determining, based on the third spot-width dataset, a third correspondence between the spot width and the parameter for exposing the photoresist, where the spot width in the third correspondence is for atomic force microscopy: determining, based on the fitting relationship, a fourth correspondence between the spot width and the parameter, where the spot width in the fourth correspondence is for atomic force microscopy: determining a second average deviation between the third correspondence and the fourth correspondence: determining uncertainty between the fourth correspondence for the atomic force microscopy and the second correspondence for the optical microscopy, when the second average deviation is less than a preset deviation threshold; and determining the first correspondence as the means for determining the parameter for exposing the photoresist, when the uncertainty is less than a preset uncertainty threshold.

In a second aspect, an apparatus for fast precise optical calibration on a photolithography system is provided. The apparatus is applied to calibration of a photolithography system, and includes: a first determining module, configured to determine a fitting relationship for a spot width corresponding to a point light source based on distribution of field strength generated by the point light source at an exit plane of a focusing element: a second determining module, configured to determine, based on the fitting relationship, a first correspondence between the spot width and a parameter for exposing a photoresist, where the spot width in the first correspondence is for optical microscopy: a third determining module, configured to determine a first spot-width dataset for the point light source based on an optical microscopic image of a spot-mapping pattern on a surface of the photoresist: a fourth determining module, configured to determine, based on the first spot-width dataset, a second correspondence between the spot width and the parameter for exposing the photoresist; and a fifth determining module, configured to determine the first correspondence as a means for determining the parameter for exposing the photoresist, when the first correspondence and the second correspondence meet a preset condition.

In an embodiment, the third determining module includes: a first acquiring sub-module, configured to acquire the optical microscopic image via an optical microscope; and a first determining sub-module, configured to determine the first spot-width dataset based on the optical microscopic image, where the first spot-width dataset corresponds to a far-field region of the point light source.

In an embodiment, the fifth determining module includes: a second acquiring sub-module, configured to acquire a first average deviation between the second correspondence and the first correspondence; and a second determining sub-module, configured to determine the first correspondence as the means for determining the parameter for exposing the photoresist, when the first average deviation is less than a preset deviation threshold.

In an embodiment, the first determining module includes a third determining sub-module, configured to determine fitting equations for spot widths corresponding to at least two point light sources, respectively, based on the distribution of the field strength generated by the at least two point light sources at the exit plane of the focusing element; and the fifth determining module includes a fourth determining sub-module, configured to determine the first correspondence corresponding to the at least two point light sources as the means for determining the parameter for exposing the photoresist, when the first correspondence and the second correspondence meet the preset condition.

In an embodiment, the focusing element includes a bowtie nano-aperture structure, and the first determining module includes: a third acquiring sub-module, configured to acquire distribution of field strength of the point light source after the point light source passes through the bowtie nano-aperture structure; and a fifth determining sub-module, configured to determine the fitting relationship based on the distribution of the field strength of the point light source.

In an embodiment, the spot width fitting relationship meets an equation:

$$w = 2\sqrt{\frac{cIT}{E_{th}}t} = 2\sqrt{\frac{cT}{E_{th}}}\sqrt{It} = a\sqrt{It};$$

where w represents the spot width, c represents an intrinsic parameter of the photolithography system, I represents the field strength generated by the point light source at the exit plane of the bowtie nano-aperture structure, t represents exposure duration, T represents transmissivity of the bowtie nano-aperture structure, $E_{th}$ represents a threshold dose for exposure, and a represents a slope of a correspondence between the spot width and the parameter for exposing the photoresist.

In an embodiment, the exposure parameter includes exposure duration and a dose for exposure, and the dose meets an equation:

$$E(r) \cong TIt\frac{c}{r^2},$$

where E(r) represents the dose, r represents a distance between a location and a center of the point light source. In a spot-mapping pattern, r represents the spot width, which corresponds to the point light source, in the spot-mapping pattern.

In an embodiment, the second determining module includes: a sixth determining sub-module, configured to determine a second spot-width dataset, which corresponds to a far-field region and a near-field region of the point light source, based on the fitting relationship; and a seventh determining sub-module, configured to determine the first correspondence based on the second spot-width dataset.

In an embodiment, the apparatus further includes: a sixth determining module, configured to determine a third spot-width dataset for the point light source based on an atomic force microscopy image of the spot-mapping pattern on the surface of the photoresist; a seventh determining module, configured to determine, based on the third spot-width dataset, a third correspondence between the spot width and the parameter for exposing the photoresist, where the spot width in the third correspondence is for atomic force microscopy: an eighth determining module, configured to determine, based on the fitting relationship, a fourth correspondence between the spot width and the parameter, where the spot width in the fourth correspondence is for atomic force microscopy: a ninth determining module, configured to determine a second average deviation between the third correspondence and the fourth correspondence: an uncertainty determining module, configured to determine uncertainty between the fourth correspondence for the atomic force microscopy and the second correspondence for the optical microscopy, when the second average deviation is less than a preset deviation threshold, and an exposure-parameter determining module, configured to determine the first correspondence as the means for determining the parameter for exposing the photoresist, when the uncertainty is less than a preset uncertainty threshold.

Beneficial effects of the apparatus according to the second aspect are same as those of the method that is described in the first aspect, or any embodiment in the first aspect, and hence are not repeated herein.

BRIEF DESCRIPTION OF THE DRAWINGS

The drawings described herein are intended for providing further understanding on the present disclosure and constitute a part of the present disclosure. Exemplary embodiments of the present disclosure and the description thereof are used for explaining the present disclosure rather than limiting the present disclosure.

DETAILED DESCRIPTION OF EMBODIMENTS

Figure 1:
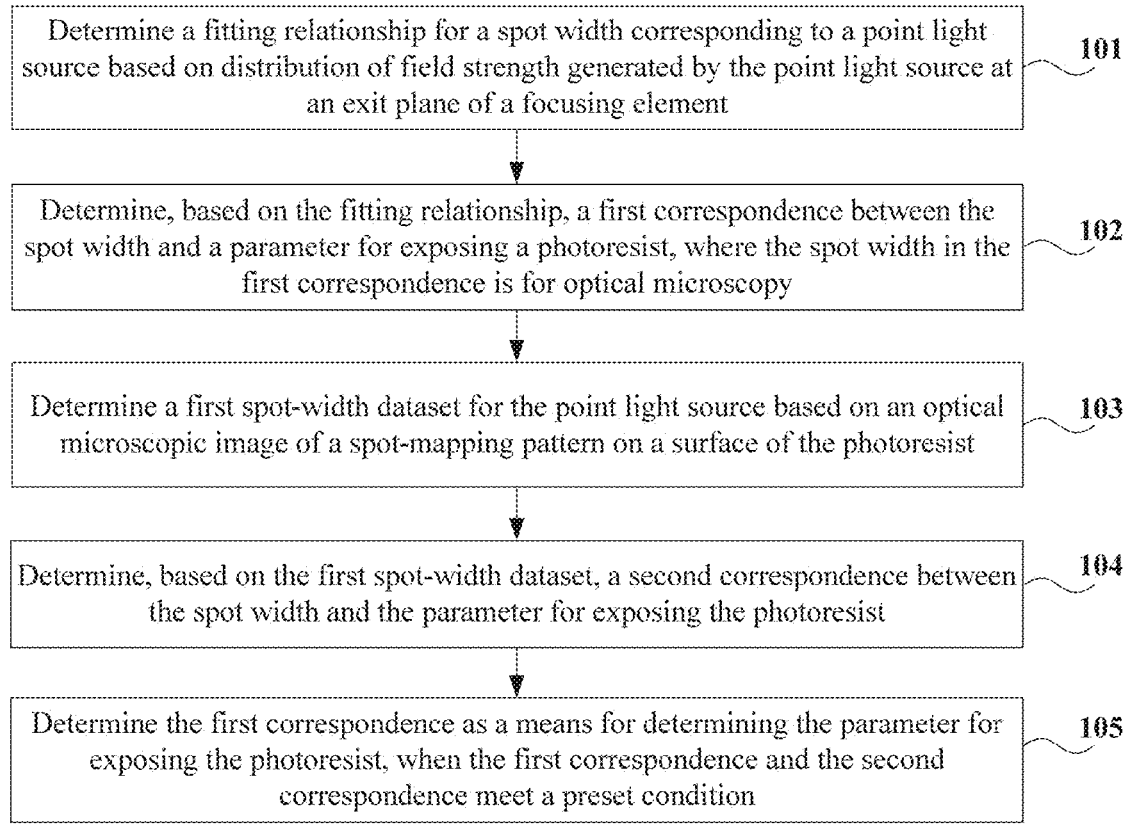
FIG. 1 is a schematic flowchart of a method for fast precise optical calibration on a photolithography system according to an embodiment of the present disclosure.

In order to clearly describe technical solutions, terms such as "first" and "second" are used to distinguish same or similar items having substantially identical functions in embodiments of the present disclosure. For example, a "first" threshold and a "second" threshold are merely configured to distinguish different thresholds, rather than limiting an order of two thresholds. Those skilled in the art may understand that the terms "first" and "second" do not limit a quantity and an operation order, and the terms "first" and "second" are not necessarily limited to indicate different entities.

Herein terms "exemplary" or "for example" are used to indicate examples, instances, or illustrations. Any embodiment or solution described as "exemplary" or "for example" herein should not be interpreted as more preferred or more advantageous than other embodiments or solutions. Specifically, the terms "exemplary" or "for example" aims to present a relevant concept in a specific way.

Herein the term "at least one" refers to one or more, and the term "multiple" refers to two or more. The term "and/or" describes a relationship between associated objects, and indicates that there may be three candidate relationships. For example, "A and/or B" may indicate a case that there is only A, a case that there are both A and B, and a case that there is only B, and both A and B may have a quantity of one or more in such cases. Generally, a symbol "/" indicates that a former object and a latter object are associated by an alternative ("or") relationship. The term "at least one of following" or similar expressions refer to any combination of following items, including any combination of a single item or multiple items. For example, "at least one of a, b, or c" may indicate a case that there is only a, a case that there is only b, a case that there is only c, a case that there are both a and b, a case that there are both b and c, a case that there are both a and c, or a case that there are both a, b, and c. Each of a, b, and c may have a quantity of one or more in such cases.

Photolithography is capable to achieve a high resolution and hence plays an important role in the field of manufacturing micro/nano structure devices. In recent years, various nano-level photolithography techniques have been successively developed to break through the optical limit and bridle the semiconductor industry in accordance with the Moore's law. Each nano-level photolithography technique faces its own challenges on a road towards micro/nano structure devices of multiple critical dimensions and complex structures. The most important issue is a capability of processing diversified large patterns in engineering applications. Thus, a photolithography system should have high alignment precision and high stability to prevent distortion of a target pattern during exposure, which results in poor quality of a final pattern in photoresist and hinders final micro/nano structure devices from achieving their functions. Since an exposed pattern transferred to the photoresist requires good uniformity and fidelity, system calibration becomes an important step in a nano-level photolithography process for accurate regulation of an exposure dose and quantitative characterization of system performances.

In photolithography, an exposure dose determines quality of an exposure pattern in photoresist directly, and highest quality of the pattern can be obtained only under an optimal exposure dose. Therefore, a purpose of calibrating a photolithography system is to achieve precise control on performances and the dose in the system and determine specific parameters for photolithography, so as to acquire the highest quality Usually, system calibration in the photolithography is complex and time-consuming. At present, researches on photolithography system calibration in China are capable to implement overlay and alignment for large chips. An overlay error can be determined only after the pattern in the exposed photoresist is measured through scanning electron microscopy (SEM), which cannot implement real-time feedback on the exposure dose in the system. Worldwide mainstream methods implements calibration on the exposure dose in the system by analyzing the photoresist or an experimental result. In an electron beam photolithography (EBI) system, a self-developing photoresist generates a real-time feedback to optimize an electron beam, improving resolution. In extreme ultraviolet photolithography (EUVL), software capable of precise simulation on EUVL process has been developed based on adjusting a physical model of a photoresist, which greatly improves reliability of the photolithography system. In conventional optical photolithography systems, sub-resolution patterns are highly sensitive to photolithography process parameters. Hence, it is usually required to measure and analyze an experimental result and obtain an actual exposure dose in the system, and then the software simulating the photolithography is calibrated to determine model parameters. In direct-writing photolithography system (DLLS), a chip holder and a direct-writing probe need to be calibrated in order to ensure a performance of exposure of the DLLS. In scanning interference photolithography, a system error is calibrated through self-calibration.

Surface plasmon (SP) super diffraction photolithography is a type of maskless near-field nano-level photolithography, and is advantageous in circumventing the diffraction limit and having a low cost. The SP super diffraction photolithography has to balance between a resolution and an exposure latitude (EL). The EL of SP the super diffraction photolithography narrows sharply with a decrease of a critical dimension of an exposure pattern, and hence an exposure dose becomes a vital factor determining quality of the exposure pattern. Especially, when the critical dimension is quite small, such as less than 100 nm, a small change in the exposure dose results in a great change in the quality of the exposure pattern directly. An inadequate exposure dose would result in an undersized or unexposed pattern, that is, the pattern is of poor fidelity. An excessive exposure dose would result in an oversized or over-exposed pattern, that is, uniformity of the pattern cannot be ensured. In a direct-writing SP super diffraction photolithography system, a bowtie nano-aperture (BNA) structure serves as a focusing element and is fixed at a bottom of a direct-writing probe. The BNA structure has better optical restraint capability and a longer cut-off wavelength than other nano-aperture structures (such as H-shaped, C-shaped, and I-shaped ones) and thus can achieve a better resolution. Experimental results have shown that a direct-writing SP super diffraction photolithography system, in which the BNA structure serves as the focusing element, can achieve a resolution of 22 nm. The exposure latitude of the direct-writing SP super diffraction photolithography system becomes rather narrow at a level of such small critical dimension. In such case, system alignment, a contact distance, sample table inclination, BNA transmission, and external vibration all have a great impact on the exposure latitude the photolithography system, and it is an urgent issue to ensure an optimal exposure dose on a photoresist surface during an exposure process. A theoretical research indicates that in a direct-writing SP super diffraction photolithography system, the exposure dose reaching a surface of the photoresist is determined by field strength at an exit plane of the BNA and exposure duration, and the exposure dose determines directly a width of a spot pattern on the photoresist surface. A change of the exposure dose with respect to the exposure duration can be precisely reflected by recording a spot-mapping pattern on the surface of the photoresist. That is, when the field strength at the exit plane of the BNA is constant, the exposure duration increases gradually according to a certain increment, and hence the exposure dose on the surface of photoresist also increases gradually. Thus, a series of spot patterns having gradually increasing widths are acquired. A calibration curve may be obtained through a change of the measured spot widths in the spot-mapping pattern with respect to the exposure dose. Such calibration curve not only reflects a calibration result of the direct-writing SP super diffraction photolithography system, but also may serve as a direct reference for determining a processing parameter required by different photolithography patterns. A spot width of such spot-mapping pattern may range from several nanometers to hundreds of nanometers, and an atomic force microscopy (AFM) is required for measurement. The atomic force microscopy takes at least four hours in measurement, which increases a time consumption and calibration complexity of the system greatly.

In SP-resonant-cavity structural imaging photolithography, a method of system automatic alignment based on stacked Moire fringe imaging is proposed. The method includes three main processes: pre-alignment, coarse alignment, and fine alignment. The pre-alignment is mainly performed to reduce an influence of manual errors and reduce time for alignment operations. Alignment marks, such as a "cross" and a "box", on a mask and a chip are aligned within an allowable margin for coarse alignment (about 100 um). In the coarse alignment, the "cross" and "box" alignment marks are detected through the SUSAN filtering algorithm and an edge detection method that is based on an Canny operator, respectively, and thereby the alignment precision is within 1 um to meet a measurement range of Moire fringes. In the fine alignment, a phase of a Moire fringe image is obtained through Fourier transform, and an actual deviation between the mask and the chip is calculated. Theoretically, the deviation in alignment is within 50 nm. In the SP-resonant-cavity structural imaging photolithography, the alignment of the photolithography devices is only the first step of system calibration, and it is necessary to calibrate an overlay error between pattern layers in photolithography. When calibrating the overlay error, a stepped control function of the SP photolithography devices are needed to obtain line grating patterns corresponding to different stepped exposure duration, and critical dimensions of the line grating patterns on the photoresist are characterized through scanning electron microscopy (SEM). Thereby, a calibration curve of the line width and an exposure dose, and the overlay error are obtained. Measured data is processed and corrected by a model, and then transmitted to a self-aligning system of the photolithography devices. With such pre-correction manner, the calibration precision of the SP-resonant-cavity structural imaging photolithography system may reach 100 nm in practice.

Conventional self-alignment methods adopt an amplification imaging system in an optical microscope, and SEM measurement and image processing. Such methods are capable to implement an automatic alignment function in the SP-resonant-cavity structural imaging photolithography system and reduce actual operation difficulties, but require a complex system and are time-consuming. The methods cannot meet a requirement one highly precise alignment and highly precise control on the exposure dose in photolithography, and hence are not widely applied.

In order to address the above issue, a method for fast optical acquisition of a calibration curve of a direct-writing SP super diffraction photolithography system, which utilizes optical microscopy (OM), is provided according to embodiments of the present disclosure. The method avoids measurement and analysis of atomic force microscopy (AFM), which are complex and time-consuming. The OM image of the spot-mapping pattern are analyzed to predict a spot width and obtain a calibration curve, quickly and precisely, which greatly reduces time for calibrating the direct-writing SP super diffraction photolithography system. The method is well applied in practice.

FIG. 1 is a schematic flowchart of a method for fast precise optical calibration on a photolithography system according to an embodiment of the present disclosure. The method is applied to calibration on a photolithography system. As shown in FIG. 1, the method includes following steps 101 to 105.

In step 101, a fitting relationship for a spot width corresponding to a point light source is determined based on distribution of field strength generated by the point light source at an exit plane of a focusing element.

The focusing element includes a bowtie nano-aperture structure. In an embodiment, the step 101 may include t following steps A1 and A2.

In step A1, distribution of field strength of the point light source, which is after the point light source passes through the bowtie nano-aperture structure, is acquired.

In step A2, the fitting relationship is determined based on the distribution of the field strength of the point light source.

The fitting relationship for the spot width meets a following equation.

$$w = 2\sqrt{\frac{cIT}{E_{th}}}t = 2\sqrt{\frac{cT}{E_{th}}}\sqrt{It} = a\sqrt{It}$$

w represents the spot width, c represents an intrinsic parameter of the photolithography system, I represents the field strength generated by the point light source at the exit plane of the bowtie nano-aperture structure, t represents exposure duration, T represents transmissivity of the bowtie nano-aperture structure, $E_{th}$ represents a threshold dose for exposure, and a represents a slope of a correspondence between the spot width and the parameter for exposing the photoresist.

The exposure parameter includes exposure duration and a dose for exposure, and the dose meets a following equation.

$$E(r) \cong TIt\frac{c}{r^2}$$

E(r) represents the dose, r represents a distance between a location and a center of the point light source. In a spot-mapping pattern, r represents the spot width, which corresponds to the point light source, in the spot-mapping pattern.

Step 102 is performed after the step S101.

In step 102, a first correspondence between the spot width and a parameter for exposing a photoresist is determined based on the fitting relationship, where the spot width in the first correspondence is for optical microscopy.

In an embodiment, the step 102 may include following steps B1 and B2.

In step B1, a second spot-width dataset, which corresponds to a far-field region and a near-field region of the point light source, is determined based on the fitting relationship.

In step B2, the first correspondence is determined based on the second spot-width dataset.

Step 103 is performed after the step 102.

In step 103, a first spot-width dataset for the point light source is determined based on an optical microscopic image of a spot-mapping pattern on a surface of the photoresist.

The optical microscopic image of the spot-mapping pattern on the surface of the photoresist is acquired through an optical microscope. The first spot-width dataset is determined based on the optical microscopic image, where the first spot-width dataset corresponds to a far-field region of the point light source.

Step 104 is performed after the step 103.

In step 104, a second correspondence between the spot width and the parameter for exposing the photoresist is determined based on the first spot-width dataset.

Each spot width in the first spot-width dataset corresponds to an exposure parameter. The second correspondence may be obtained based on a relationship between the multiple spot widths in the first spot-width dataset and the corresponding exposure parameters. The second correspondence may refer to an experimental calibration curve of optical microscopy (OM).

Step 105 is determined after the step 104.

In step 105, the first correspondence is determined as a means for determining the parameter for exposing the photoresist, when the first correspondence and the second correspondence meet a preset condition.

A first average deviation between the second correspondence and the first correspondence is acquired. The first correspondence is determined as the means for determining the parameter for exposing the photoresist, when the first average deviation is less than a preset deviation threshold.

In summary, the method for fast precise optical calibration on the photolithography system is provided according to embodiments of the present disclosure. The fitting relationship for the spot width corresponding to the point light source is determined based on the distribution of the field strength generated by the point light source at the exit plane of the focusing element. The first correspondence between the spot width and the parameter for exposing the photoresist is determined based on the fitting relationship, where the spot width in the first correspondence is for the optical microscopy. The first spot-width dataset for the point light source is determined based on the optical microscopic image of the spot-mapping pattern on the surface of the photoresist. The second correspondence between the spot width and the parameter for exposing the photoresist is determined based on the first spot-width dataset. The first correspondence serves as the means for determining the parameter for exposing the photoresist, when the first correspondence and the second correspondence meet the preset condition. The first correspondence having high accuracy can be obtained through the fitting relationship derived from the distribution of the field strength generated by the point light source, and the parameter for exposure can be determined based on the first correspondence. The forgoing process is fast. Generally, the parameter can be determined in approximate 2 minutes, while it takes at least 4 hours through atomic force microscopy in conventional technology. The method for fast precise optical calibration on the photolithography system according to embodiments of the present disclosure can obtain the parameter for exposure rapidly, the parameter for exposure can be timely measured in experiments, and a process of the experiments can be accurately adjusted and controlled based on the parameter. A simple process is achieved since it takes less time to determine the parameter for exposure.

Figure 2:
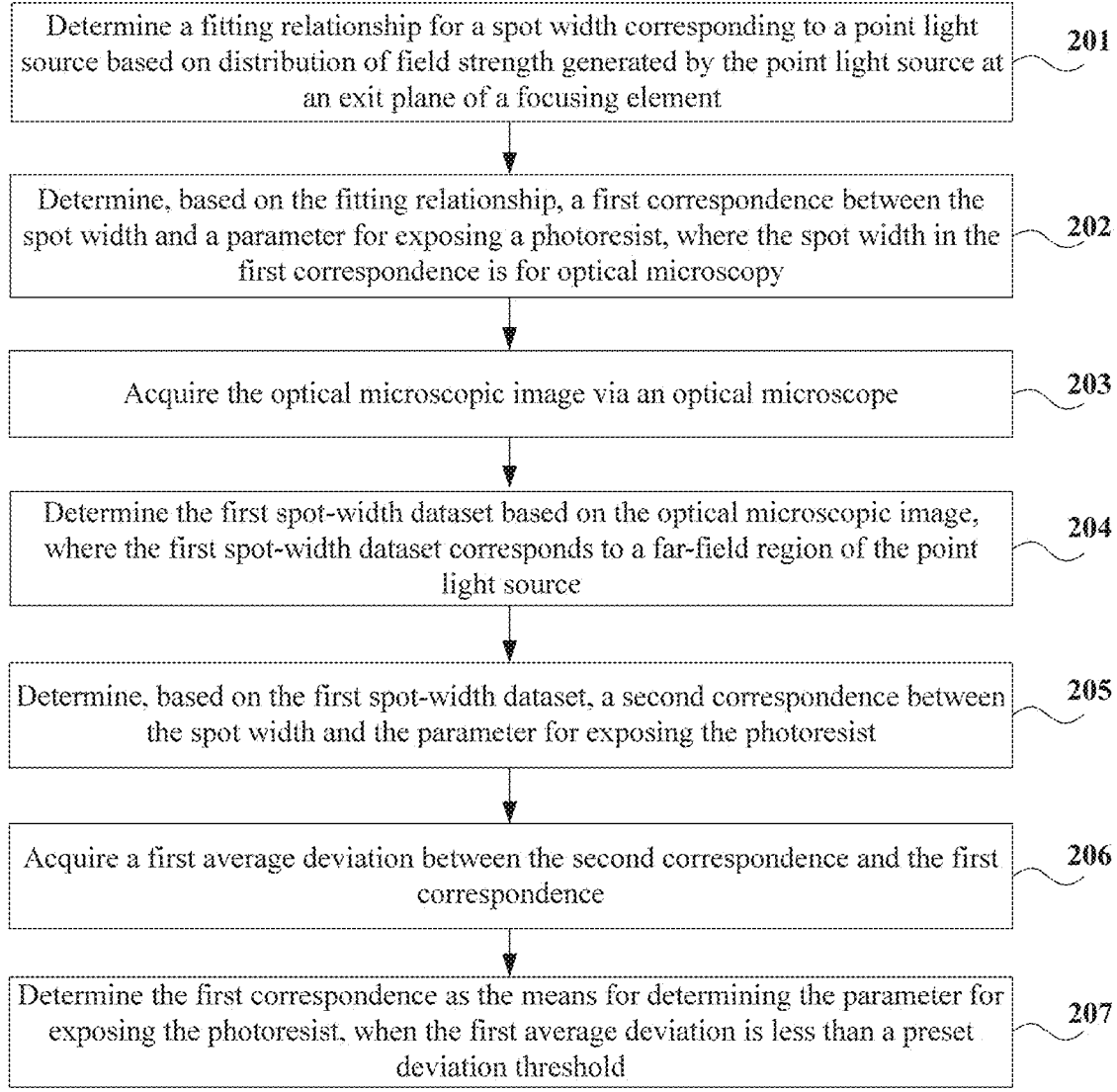
FIG. 2 is a schematic flowchart of a method for fast precise optical calibration on a photolithography system according to another embodiment of the present disclosure.

FIG. 2 is a schematic flowchart of a method for fast precise optical calibration on a photolithography system according to another embodiment of the present disclosure. The method is applied to calibration on a photolithography system. As shown in FIG. 2, the method includes following steps 201 to 207.

In step 201, a fitting relationship for a spot width corresponding to a point light source is determined based on distribution of field strength generated by the point light source at an exit plane of a focusing element.

The focusing element includes a bowtie nano-aperture (BNA) structure. In an embodiment, the step 201 may include t following steps A1 and A2.

In step A1, distribution of field strength of the point light source, which is after the point light source passes through the BNA structure, is acquired.

Figure 3:
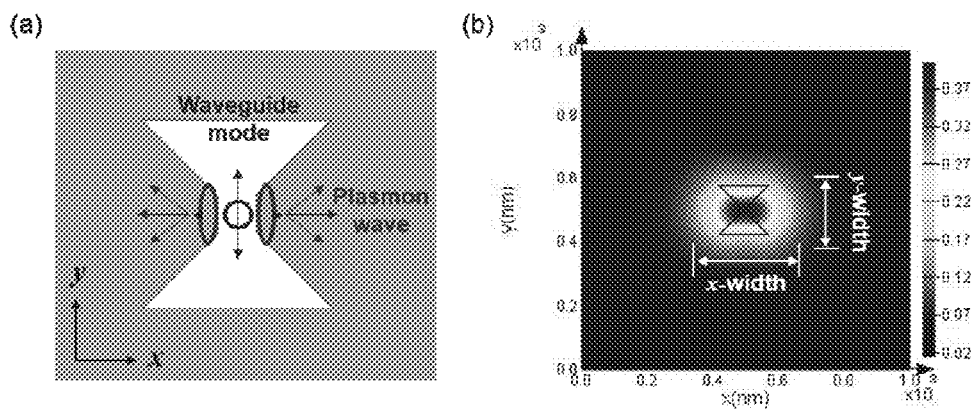
FIG. 3 is a schematic diagram showing a mechanism of wave transmission and distribution of field strength at an exit plane of a bowtie nano-aperture structure according to an embodiment of the present disclosure.

As an example, FIG. 3 shows a schematic diagram showing a mechanism of wave transmission and distribution of field strength at an exit plane of a BNA structure according to an embodiment of the present disclosure. As shown in FIG. 3 (a), according to the Huygens principle, the point light source generates a spherical near-field plasmon wave in y direction in a waveguide mode, after passing through the BNA. As shown in FIG. 3 (b), the spot width may be expressed as (x-width and y-width).

In step A2, the fitting relationship is determined based on the distribution of the field strength of the point light source.

The fitting relationship for the spot width meets a following equation.

$$w = 2\sqrt{\frac{cIT}{E_{th}}}t = 2\sqrt{\frac{cT}{E_{th}}}\sqrt{It} = a\sqrt{It}$$

w represents the spot width (y-width), c represents an intrinsic parameter of the photolithography system, I represents the field strength generated by the point light source at the exit plane of the bowtie nano-aperture structure, t represents exposure duration, T represents transmissivity of the bowtie nano-aperture structure, $E_{th}$ represents a threshold dose for exposure, and a represents a slope of a correspondence between the spot width and the parameter for exposing the photoresist.

In an embodiment, a photolithography system may refer to an SP super diffraction photolithography system, an exposure dose in the SP super diffraction photolithography system is mainly determined by stability of the system. Therefore, a may be regarded as an important parameter for characterizing the stability of the photolithography system, and the exposure parameter may be determined after a value of a is determined.

The exposure parameter includes exposure duration and a dose for exposure, and the dose meets a following equation.

$$E(r) \cong TIt\frac{c}{r^2}$$

E(r) represents the dose, r represents a distance between a location and a center of the point light source. In a spot-mapping pattern, r represents the spot width, which corresponds to the point light source, in the spot-mapping pattern.

Step 202 is performed after the step S201.

In step 202, a first correspondence between the spot width and a parameter for exposing a photoresist is determined based on the fitting relationship, where the spot width in the first correspondence is for optical microscopy.

In an embodiment, the step 202 may include following steps B1 and B2.

In step B1, a second spot-width dataset, which corresponds to a far-field region and a near-field region of the point light source, is determined based on the fitting relationship.

All spot widths, from both a far-field region and a near-field region, may be determined based on the fitting relationship.

In step B2, the first correspondence is determined based on the second spot-width dataset.

Herein the first correspondence may be determined based on spot widths in the second spot-width dataset and the exposure parameters, that is, the first correspondence may be a theoretical calibration curve of OM.

Step 203 is performed after the step 202

Figure 4:
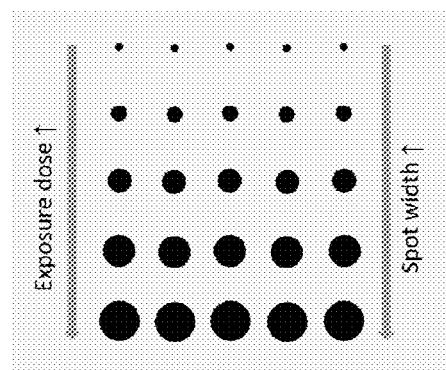
FIG. 4 is a schematic diagram of a spot-mapping pattern on a surface of a photoresist according to an embodiment of the present disclosure.

In step 203, an optical microscopic image of a spot-mapping pattern on a surface of a photoresist is acquired through an optical microscope As an example, FIG. 4 shows a schematic diagram of a spot-mapping pattern on a surface of a photoresist according to an embodiment of the present disclosure. The spot-mapping pattern may be recorded on the surface of the photoresist in direct-writing SP super diffraction photolithography. Further, the optical microscopic image of the spot-mapping pattern may be collect by the optical microscope (OM), and hence the optical microscope image is acquired. The OM is capable of acquiring the spot-mapping pattern on the surface of the photoresist rapidly.

Step 204 is performed after the step 203.

In step 204, a first spot-width dataset is determined based on the optical microscopic image, where the first spot-width dataset corresponds to a far-field region of the point light source.

Herein the first point width dataset corresponding to the far-field region may be acquired through processing (e.g. by Matlab™) the optical microscopic image.

Step 205 is performed after the step 204.

In step 205, a second correspondence between the spot width and the parameter for exposing the photoresist is determined based on the first spot-width dataset.

Each spot width in the first spot-width dataset corresponds to an exposure parameter. The second correspondence may be obtained based on a relationship between the multiple spot widths in the first spot-width dataset and the corresponding exposure parameters. The second correspondence may refer to an experimental calibration curve of OM.

Figure 5:
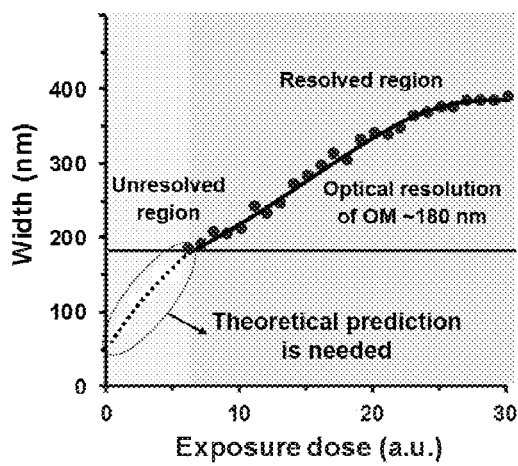
FIG. 5 is a schematic graph of an experimental calibration curve and a theoretical calibration curve of optical microscopy according to an embodiment of the present disclosure.

As n example, FIG. 5 is a schematic diagram showing an experimental calibration curve and a theoretical calibration curve of OM according to an embodiment of the present disclosure. As shown in FIG. 5, the horizontal axis "Exposure dose" represents an exposure dose, a vertical axis "Width" represents a spot width, the "Unresolved region" represents the near-field region, and the "Resolved region" represents a far-field region. The line starting with "Optical resolution" represents that an optical resolution of OM is 180 nm. The line "Theoretical prediction is needed" represents that a curve is theoretically predicated from the OM data and the curve indicates a relationship between the spot width in the near-field region and the exposure parameter. The solid dots represent the experimental calibration curve of OM, and the solid line represents the theoretical calibration curve of OM. The multiple solid points representing the experimental calibration curve of OM may be obtained based on association between multiple spot widths in the first spot-width dataset and the corresponding exposure parameters.

Step 206 is performed after the step 205.

In step 206, a first average deviation between the second correspondence and the first correspondence is acquired.

Herein the first average deviation may be calculated between the experimental calibration curve and the theoretical calibration curve of OM.

Step 207 is performed after the step 206.

In step 207, the first correspondence is determined as a means for determining the parameter for exposing the photoresist, when the first average deviation is less than a preset deviation threshold.

Herein a value of the preset deviation threshold is not limited and may be adjusted according to an actual application scenario. The first average deviation being less than the preset deviation threshold indicates that the theoretical calibration curve of OM is accurate, and that the theoretical calibration curve of OM may serve as a basis for determining the parameter for exposing the photoresist.

In an embodiment, fitting equations for spot widths corresponding to at least two point light sources, respectively, may be determined based on the distribution of the field strength generated by the at least two point light sources at the exit plane of the focusing element. When the first correspondence and the second correspondence meet the preset condition, the first correspondence corresponding to the at least two point light sources may serve as the means for determining the parameter for exposing the photoresist.

In an embodiment of the present disclosure, a third spot-width dataset for the point light source is determined based on an atomic force microscopy (AFM) image of the spot-mapping pattern on the surface of the photoresist. A third correspondence (an experimental calibration curve of AFM) between the spot width and the parameter for exposing the photoresist is determined based on the third spot-width dataset, where the spot width in the third correspondence is for atomic force microscopy. A fourth correspondence (an experimental calibration curve of AFM) between the spot width and the parameter for exposing the photoresist is determined based on the fitting relationship, where the spot width in the fourth correspondence is for atomic force microscopy A second average deviation between the third correspondence and the fourth correspondence is determined, that is, an average deviation (A.D.) between the theoretical calibration curve and the experimental calibration curve of AFM is determined. Uncertainty between the fourth correspondence for the AFM and the second correspondence for the OM is determined, that is, uncertainty between the theoretical calibration curves of the AFM and the OM is calculated, when the second average deviation is less than a preset deviation threshold. The uncertainty may be calculated according to an equation $$\text{Uncertainty} = \frac{\sum_{i=1}^{n} A.D.}{n},$$

where Uncertainty represents the uncertainty, and A.D. represents the average deviation. Furthermore, slopes of theoretical calibration curves of different OM may be compared to calculate stability of the direct writing SP super diffraction photolithography system.

Figure 6:
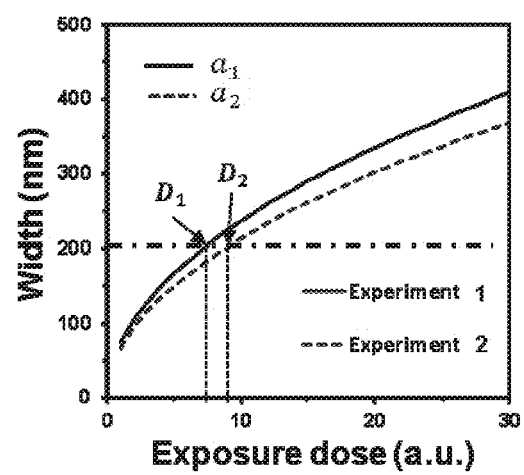
FIG. 6 is a schematic diagram showing comparison between theoretical calibration curves of different optical microscopy according to an embodiment of the present disclosure.

As an example, FIG. 6 shows a schematic diagram illustrating comparison between theoretical calibration curves of different OM according to an embodiment of the present disclosure. The horizontal axis "Exposure dose" represents the exposure dose, the vertical axis "Width" represents the spot width. The solid line represents a theoretical calibration curve of first OM, i.e. "Experiment 1", and the dotted line represents a theoretical calibration curve of second OM, i.e. "Experiment 2". The solid line has a slope of a1, and the dotted line has a slope of a2. Assuming a scenario in which the spot width is equal to 200 nm, the theoretical calibration curve of first OM has a corresponding exposure dose D1 and the theoretical calibration curve of second OM has a corresponding exposure dose D2. In a case that a1 serves as a reference, the system stability between the two exposure conditions may be calculated based on $$\text{System stability} = 1 - \frac{|a_1 - a_2|}{a_1} * 100\%.$$

The stability within a preset range indicates that the photolithography system is stable.

The first correspondence is determined as the means for determining the parameter for exposing the photoresist, when the uncertainty is less than a preset uncertainty threshold. Calibration is performed based on the uncertainty until the uncertainty is less than the preset uncertainty threshold, when the uncertainty is greater than or equal to the preset uncertainty threshold.

A method based on the optical microscope fast imaging technology is provided according to embodiments of the present disclosure for simply and precisely acquiring a calibration curve of a direct-writing SP super diffraction photolithography system, where data fitting is performed based on the OM image of the spot-mapping pattern on the surface of the photoresist. Measuring the spot widths in the spot-mapping pattern through the OM is hundreds of times faster than measuring the spot widths in the spot-mapping pattern through the AFM (generally, measurement through the OM takes 2 minutes while measurement through the AFM takes more than 4 hours). Due to an optical resolution limit of the OM, it is difficult to precisely acquire a spot width by the OM when the critical dimension reaches 180 nm. Therefore, in embodiments of the present disclosure, propagation mechanism concerning the field strength at the exit plane of the BNA is analyzed to derive an fitting equation for predicting spot widths of all spot patterns, in both the far-field region and the near-field region, of the direct writing SP super diffraction photolithography. The system calibration curve obtained through OM measurement has high precision in view of that obtained through AFM measurement, and uncertainty between the two calibration curves is as small as 3%. The stability of the direct writing SP super diffraction photolithography system can be quickly calculated by comparing OM calibration curves obtained in different experiments, and thereby it is convenient to regulate the exposure dose precisely in real time during the experiments.

In embodiments of the present disclosure, the distribution of the field strength at the exit plane of the focusing element. e.g. BNA, in the direct writing SP super diffraction photolithography system is analyzed to derive the theoretical equation for fitting both distribution of field intensity in the far-field and distribution of field intensity in the near-field and establish a model for a calibration curve. Further, the OM has the advantage of acquiring the optical image of the spot-mapping pattern quickly. By combining the above two factors, the limitation of the optical resolution in the OM is circumvented, and a method for acquiring the calibration curve of the direct writing SP super diffraction photolithography system simply, accurately, and quickly is provided for precise determination of the exposure parameter. With such method, the exposure dose can be precisely regulated during the exposure of arbitrary pattern, and a finally obtained pattern has optimal quality. Important technical support is provided for developing low-cost, large-area, and high-quality nano-optical photolithography.

The method for fast precise optical calibration on a photolithography system is provided according to embodiments of the present disclosure, and the method is based on image processing and data fitting concerning optical microscopy. The distribution of the field strength at the exit plane of a plasma-excitation BNA is analyzed to establish a calibration model for the direct-writing SP super diffraction photolithography system. The advantage of quickly acquiring the optical image of the spot-mapping pattern through the OM is combined with image processing and data fitting to circumvent the optical limitation (about 180 nm) of the OM. Thereby, the spot width in the near-field region of the direct writing SP super diffraction photolithography can be precisely obtained through fitting, and it is not necessary to spending time in measurement through the AFM, which greatly improves the overall efficiency of the photolithography. In comparison with conventional method for optical calibration on a photolithography system, the method according to embodiments of the present disclosure achieves precise regulation on the exposure dose required by arbitrary pattern. In addition, the slope a in embodiments of the present disclosure is a parameter related to the exposure dose, and the stability of the photolithography system can be calculated by comparing the slopes a of different calibration curves. Thereby, a candidate technique is provided for expanding practical application of the direct-writing SP super diffraction photolithography in processing and manufacturing the next generation of micro/nano structure devices, which are large and cheap.

In summary, the method for fast precise optical calibration on the photolithography system is provided according to embodiments of the present disclosure. The fitting relationship for the spot width corresponding to the point light source is determined based on the distribution of the field strength generated by the point light source at the exit plane of the focusing element. The first correspondence between the spot width and the parameter for exposing the photoresist is determined based on the fitting relationship, where the spot width in the first correspondence is for the optical microscopy. The first spot-width dataset for the point light source is determined based on the optical microscopic image of the spot-mapping pattern on the surface of the photoresist. The second correspondence between the spot width and the parameter for exposing the photoresist is determined based on the first spot-width dataset. The first correspondence serves as the means for determining the parameter for exposing the photoresist, when the first correspondence and the second correspondence meet the preset condition. The first correspondence having high accuracy can be obtained through the fitting relationship derived from the distribution of the field strength generated by the point light source, and the parameter for exposure can be determined based on the first correspondence. The forgoing process is fast. Generally, the parameter can be determined in approximate 2 minutes, while it takes at least 4 hours through atomic force microscopy in conventional technology. The method for fast precise optical calibration on the photolithography system according to embodiments of the present disclosure can obtain the parameter for exposure rapidly, the parameter for exposure can be timely measured in experiments, and a process of the experiments can be accurately adjusted and controlled based on the parameter. A simple process is achieved since it takes less time to determine the parameter for exposure.

Figure 7:
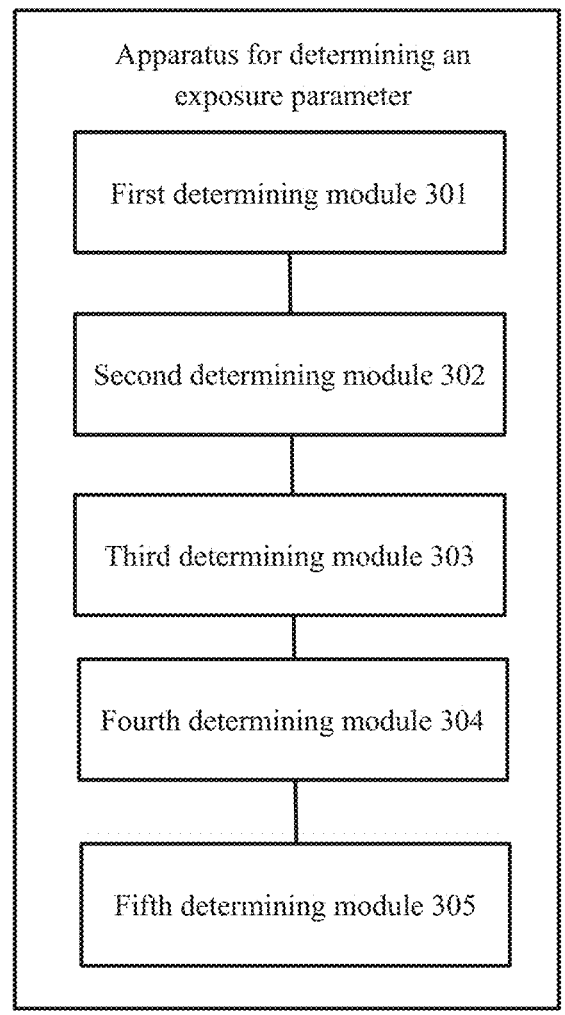
FIG. 7 is a schematic structural diagram of an apparatus for fast precise optical calibration on a photolithography system according to an embodiment of the present disclosure.

FIG. 7 is a schematic structural diagram of an apparatus for fast precise optical calibration on a photolithography system according to an embodiment of the present disclosure. The system is applied to calibration on a photolithography system. As shown in FIG. 7, the apparatus includes a first determining module 301, a second determining module 302, a third determining module 303, a fourth determining module 304, and a fifth determining module 305.

The first determining module 301 is configured to determine a fitting relationship for a spot width corresponding to a point light source based on distribution of field strength generated by the point light source at an exit plane of a focusing element.

The second determining module 302 is configured to determine, based on the fitting relationship, a first correspondence between the spot width and a parameter for exposing a photoresist, where the spot width in the first correspondence is for optical microscopy.

The third determining module 303 is configured to determine a first spot-width dataset for the point light source based on an optical microscopic image of a spot-mapping pattern on a surface of the photoresist.

The fourth determining module 304 is configured to determine, based on the first spot-width dataset, a second correspondence between the spot width and the parameter for exposing the photoresist.

The fifth determining module 305 is configured to determine the first correspondence as a means for determining the parameter for exposing the photoresist, when the first correspondence and the second correspondence meet a preset condition.

In an embodiment, the third determining module includes a first acquiring sub-module and a first determining sub-module.

The first acquiring sub-module is configured to acquire the optical microscopic image via an optical microscope.

The first determining sub-module is configured to determine the first spot-width dataset based on the optical microscopic image, where the first spot-width dataset corresponds to a far-field region of the point light source.

In an embodiment, the fifth determining module includes a second acquiring sub-module and a second determining sub-module.

The second acquiring sub-module is configured to acquire a first average deviation between the second correspondence and the first correspondence.

The second determining sub-module is configured to determine the first correspondence as the means for determining the parameter for exposing the photoresist, when the first average deviation is less than a preset deviation threshold.

In an embodiment, the first determining module includes a third determining sub-module, configured to determine fitting equations for spot widths corresponding to at least two point light sources, respectively, based on the distribution of the field strength generated by the at least two point light sources at the exit plane of the focusing element. The fifth determining module includes a fourth determining sub-module, configured to determine the first correspondence corresponding to the at least two point light sources as the means for determining the parameter for exposing the photoresist, when the first correspondence and the second correspondence meet the preset condition.

In an embodiment, the focusing element includes a bowtie nano-aperture structure. The first determining module includes a third acquiring sub-module and a fifth determining sub-module.

The third acquiring sub-module is configured to acquire distribution of field strength of the point light source after the point light source passes through the bowtie nano-aperture structure.

The fifth determining sub-module, configured to determine the fitting relationship based on the distribution of the field strength of the point light source In an embodiment, the spot width fitting relationship meets a following equation.

$$w = 2\sqrt{\frac{cIT}{E_{th}}}t = 2\sqrt{\frac{cT}{E_{th}}}\sqrt{It} = a\sqrt{It}$$

w represents the spot width, c represents an intrinsic parameter of the photolithography system, I represents the field strength generated by the point light source at the exit plane of the bowtie nano-aperture structure, t represents exposure duration, T represents transmissivity of the bowtie nano-aperture structure, $E_{th}$ represents a threshold dose for exposure, and a represents a slope of a correspondence between the spot width and the parameter for exposing the photoresist.

In an embodiment, the exposure parameter includes exposure duration and a dose for exposure, and the dose meets a following equation.

$$E(r) \cong TIt\frac{c}{r^2}$$

E(r) represents the dose, r represents a distance between a location and a center of the point light source. In a spot-mapping pattern, r represents the spot width, which corresponds to the point light source, in the spot-mapping pattern.

In an embodiment, the second determining module includes a sixth determining sub-module and a seventh determining sub-module.

The sixth determining sub-module is configured to determine a second spot-width dataset, which corresponds to a far-field region and a near-field region of the point light source, based on the fitting relationship.

The seventh determining sub-module is configured to determine the first correspondence based on the second spot-width dataset.

In an embodiment, the apparatus further includes a sixth determining module, a seventh determining module, an eighth determining module, a ninth determining module and an uncertainty determining module.

The sixth determining module is configured to determine a third spot-width dataset for the point light source based on an atomic force microscopy image of the spot-mapping pattern on the surface of the photoresist.

The seventh determining module is configured to determine, based on the third spot-width dataset, a third correspondence between the spot width and the parameter for exposing the photoresist, where the spot width in the third correspondence is for atomic force microscopy The eighth determining module is configured to determine, based on the fitting relationship, a fourth correspondence between the spot width and the parameter, where the spot width in the fourth correspondence is for atomic force microscopy.

The ninth determining module is configured to determine a second average deviation between the third correspondence and the fourth correspondence.

The uncertainty determining module is configured to determine uncertainty between the fourth correspondence for the atomic force microscopy and the second correspondence for the optical microscopy, when the second average deviation is less than a preset deviation threshold.

In an embodiment, the apparatus further includes an exposure-parameter determining module and a calibration module.

The exposure-parameter determining module is configured to determine the first correspondence as the means for determining the parameter for exposing the photoresist, when the uncertainty is less than a preset uncertainty threshold.

The calibration module is configured to perform calibration based on the uncertainty until the uncertainty is less than the preset uncertainty threshold, when the uncertainty is greater than or equal to the preset uncertainty threshold.

The apparatus for fast precise optical calibration on the photolithography system is provided according to embodiments of the present disclosure. The fitting relationship for the spot width corresponding to the point light source is determined based on the distribution of the field strength generated by the point light source at the exit plane of the focusing element. The first correspondence between the spot width and the parameter for exposing the photoresist is determined based on the fitting relationship, where the spot width in the first correspondence is for the optical microscopy. The first spot-width dataset for the point light source is determined based on the optical microscopic image of the spot-mapping pattern on the surface of the photoresist. The second correspondence between the spot width and the parameter for exposing the photoresist is determined based on the first spot-width dataset. The first correspondence serves as the means for determining the parameter for exposing the photoresist, when the first correspondence and the second correspondence meet the preset condition. The first correspondence having high accuracy can be obtained through the fitting relationship derived from the distribution of the field strength generated by the point light source, and the parameter for exposure can be determined based on the first correspondence. The forgoing process is fast. Generally, the parameter can be determined in approximate 2 minutes, while it takes at least 4 hours through atomic force microscopy in conventional technology. The apparatus for fast precise optical calibration on the photolithography system according to embodiments of the present disclosure can obtain the parameter for exposure rapidly, the parameter for exposure can be timely measured in experiments, and a process of the experiments can be accurately adjusted and controlled based on the parameter. A simple process is achieved since it takes less time to determine the parameter for exposure.

The apparatus for fast precise optical calibration on the photolithography system according to embodiments of the present disclosure is capable to implement the method for for fast precise optical calibration on the photolithography system concerning any one of FIGS. 1 to 6. Details are not repeated herein for conciseness.

Although the present disclosure is described herein in conjunction with embodiments, those skilled in the art can appreciate and implement alternatives of the disclosed embodiments based on teachings of the drawings, the specification, and the claims when implementing the present disclosure. In the claims, the term "comprising" does not exclude components or steps that are not listed, and the term "a/an" or "one" does not exclude a case of multiple items. A single processor or another unit may implement several functions enumerated in the claims. Means that are recorded in different dependent claims do not indicate that these means cannot be combined to achieve a good effect.

Although the present disclosure is described in conjunction with specific features and embodiments, it is apparent that various modifications and combinations can be made without departing from the spirit and scope of the present disclosure. Accordingly, the specification and the drawings are merely exemplary description of the present disclosure that is defined in the claims, and should be construed to cover all modifications, changes, combinations or equivalents within the scope of the present disclosure. Apparently, those skilled in the art may make various changes and variations to the present disclosure without departing from the spirit and scope of the present disclosure. Hence, such changes and variations of the present disclosure fall within the scope of the claims of the present disclosure and equivalent technologies thereof, and the present disclosure is intended for including such changes and variations.

The invention claimed is:

1. A method for fast precise optical calibration on a photolithography system, comprising:
   determining a mathematical equation for a spot width corresponding to a point light source based on distribution of field strength generated by the point light source at an exit plane of a focusing element, wherein the mathematical equation reflects a relationship between the spot width and a parameter for exposing a photoresist;
   determining, based on the mathematical equation, a first correspondence between the spot width and the parameter for exposing the photoresist;
   determining a first spot-width dataset for the point light source based on an optical microscopic image of a spot-mapping pattern on a surface of the photoresist, wherein spot widths in the first spot-width dataset is for optical microscopy;
   determining, based on the first spot-width dataset, a second correspondence between the spot width and the parameter for exposing the photoresist, wherein the second correspondence is recorded in the first spot-width dataset; and
   determining the first correspondence as a means for determining the parameter for exposing the photoresist, when the first correspondence and the second correspondence meet a preset condition,
   wherein the focusing element comprises a bowtie nano-aperture structure, and
   determining the mathematical equation for the spot width corresponding to the point light source based on the distribution of the field strength generated by the point light source at the exit plane of the focusing element comprises:
      acquiring distribution of field strength of the point light source after light emitted by the point light source passes through the bowtie nano-aperture structure; and
      determining the mathematical equation based on the distribution of the field strength of the point light source.

2. The method according to claim 1, wherein determining the first spot-width dataset for the point light source based on the optical microscopic image of the spot-mapping pattern on the surface of the photoresist comprises:
   acquiring the optical microscopic image via an optical microscope; and
   determining the first spot-width dataset based on the optical microscopic image, wherein the first spot-width dataset corresponds to a far-field region of the point light source.

3. The method according to claim 1, wherein determining the first correspondence as the means for determining the parameter for exposing the photoresist, when the first correspondence and the second correspondence meet the preset condition, comprises:
   acquiring a first average deviation between the second correspondence and the first correspondence; and
   determining the first correspondence as the means for determining the parameter for exposing the photoresist, when the first average deviation is less than a preset deviation threshold.

4. The method according to claim 1, wherein:
   determining the mathematical equation for the spot width corresponding to the point light source based on the distribution of the field strength generated by the point light source at the exit plane of the focusing element comprises:
      determining mathematical equations for spot widths corresponding to at least two point light sources, respectively, based on the distribution of the field strength generated by the at least two point light sources at the exit plane of the focusing element; and
   determining the first correspondence as the means for determining the parameter for exposing the photoresist, when the first correspondence and the second correspondence meet the preset condition, comprises:
      determining the first correspondence as the means for determining the parameter for exposing the photoresist, when the first correspondence and the second correspondence meet the preset condition for the at least two point light sources.

5. The method according to claim 1, wherein the mathematical equation for the spot width is:

$$w = 2\sqrt{\frac{cIT}{E_{th}}t} = 2\sqrt{\frac{cT}{E_{th}}}\sqrt{It} = a\sqrt{It},$$

wherein w represents the spot width, c represents an intrinsic parameter of the photolithography system, I represents the field strength generated by the point light source at the exit plane of the bowtie nano-aperture structure, t represents exposure duration, T represents transmissivity of the bowtie nano-aperture structure, and Eth represents a threshold dose for exposure.

6. The method according to claim 5, wherein the parameter for exposing the photoresist comprises exposure duration and a dose for exposure, and the dose meets an equation:

$$E(r) \cong TIt\frac{c}{r^2};$$

where E(r) represents the dose, r represents a distance between a location and a center of the point light source.

7. The method according to claim 1, wherein determining, based on the mathematical equation, the first correspondence between the spot width and the parameter for exposing the photoresist comprises:
   determining a second spot-width dataset, which corresponds to a far-field region and a near-field region of the point light source, based on the mathematical equation; and
   determining the first correspondence based on the second spot-width dataset.

8. The method according to claim 1, wherein after determining the mathematical equation for the spot width corresponding to the point light source based on the distribution of the field strength generated by the point light source at the exit plane of the focusing element, the method further comprises:
   determining a third spot-width dataset for the point light source based on an atomic force microscopy image of the spot-mapping pattern on the surface of the photoresist;
   determining, based on the third spot-width dataset, a third correspondence between the spot width and the parameter for exposing the photoresist, where the spot width in the third correspondence is for atomic force microscopy;

determining, based on the mathematical equation, a fourth correspondence between the spot width and the parameter, where the spot width in the fourth correspondence is for atomic force microscopy;

determining a second average deviation between the third correspondence and the fourth correspondence;

determining uncertainty between the fourth correspondence for the atomic force microscopy and the first correspondence for the optical microscopy, when the second average deviation is less than a preset deviation threshold; and determining the first correspondence as the means for determining the parameter for exposing the photoresist, when the uncertainty is less than a preset uncertainty threshold.

9. An apparatus for fast precise optical calibration on a photolithography system, comprising:

a first determining module, configured to determine a mathematical equation for a spot width corresponding to a point light source based on distribution of field strength generated by the point light source at an exit plane of a focusing element, wherein the mathematical equation reflects a relationship between the spot width and a parameter for exposing a photoresist;

a second determining module, configured to determine, based on the mathematical equation, a first correspondence between the spot width and the parameter for exposing the photoresist;

a third determining module, configured to determine a first spot-width dataset for the point light source based on an optical microscopic image of a spot-mapping pattern on a surface of the photoresist;

a fourth determining module, configured to determine, based on the first spot-width dataset, a second correspondence between the spot width and the parameter for exposing the photoresist, wherein the second correspondence is recorded in the first spot-width dataset; and a fifth determining module, configured to determine the first correspondence as a means for determining the parameter for exposing the photoresist, when the first correspondence and the second correspondence meet a preset condition wherein the focusing element comprises a bowtie nano-aperture structure, and the first determining module is further configured to acquire distribution of field strength of the point light source after light emitted by the point light source passes through the bowtie nano-aperture structure, and determine the mathematical equation based on the distribution of the field strength of the point light source.

* * * * *